(12) United States Patent
Otremba

(10) Patent No.: US 8,691,631 B2
(45) Date of Patent: Apr. 8, 2014

(54) DEVICE INCLUDING TWO MOUNTING SURFACES

(75) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 12 days.

(21) Appl. No.: 13/424,987

(22) Filed: Mar. 20, 2012

(65) Prior Publication Data

US 2012/0178216 A1 Jul. 12, 2012

Related U.S. Application Data

(62) Division of application No. 12/241,742, filed on Sep. 30, 2008, now Pat. No. 8,138,587.

(51) Int. Cl.
*H01L 21/50* (2006.01)

(52) U.S. Cl.
USPC ......... 438/124; 438/106; 257/666; 257/730; 257/784; 257/787; 257/E23.019

(58) Field of Classification Search
USPC .......................................... 257/734; 438/122
See application file for complete search history.

(56) References Cited

U.S. PATENT DOCUMENTS

| | | | |
|---|---|---|---|
| 6,078,102 A | 6/2000 | Crane, Jr. et al. | |
| 6,249,041 B1 | 6/2001 | Kasem et al. | |
| 6,597,059 B1 | 7/2003 | McCann et al. | |
| 7,166,919 B2 * | 1/2007 | Tabira | 257/730 |
| 7,271,470 B1 | 9/2007 | Otremba | |
| 7,285,849 B2 * | 10/2007 | Cruz et al. | 257/690 |
| 7,633,141 B2 | 12/2009 | Huber | |
| 7,663,222 B2 | 2/2010 | Lohninger et al. | |
| 7,678,609 B2 * | 3/2010 | Pavier | 438/106 |
| 7,947,532 B2 | 5/2011 | Otremba et al. | |
| 8,227,908 B2 * | 7/2012 | Otremba et al. | 257/692 |
| 8,319,323 B2 * | 11/2012 | Letterman et al. | 257/678 |
| 2001/0004115 A1 | 6/2001 | Olofsson et al. | |
| 2002/0151112 A1 | 10/2002 | Song | |
| 2003/0113954 A1 | 6/2003 | Glenn et al. | |
| 2003/0122232 A1 | 7/2003 | Hirano et al. | |

(Continued)

FOREIGN PATENT DOCUMENTS

DE 10 2004 021 054 11/2005

OTHER PUBLICATIONS

Office Action mailed Feb. 10, 2011, in U.S. Appl. No. 12/241,742.

(Continued)

*Primary Examiner* — Colleen Matthews
*Assistant Examiner* — William Harriston
(74) *Attorney, Agent, or Firm* — Dicke, Billig & Czaja, PLLC

(57) ABSTRACT

A device including two mounting surfaces. One embodiment provides a power semiconductor chip and having a first electrode on a first surface and a second electrode on a second surface opposite to the first surface. A first external contact element and a second external contact element, are both electrically coupled to the first electrode of the semiconductor chip. A third external contact element and a fourth external contact element, both electrically coupled to the second electrode of the semiconductor chip. A first mounting surface is provided on which the first and third external contact elements are disposed. A second mounting surface is provided on which the second and fourth external contact elements are disposed.

7 Claims, 14 Drawing Sheets

(56) References Cited

U.S. PATENT DOCUMENTS

| | | |
|---|---|---|
| 2004/0007772 A1* | 1/2004 | Arai et al. ............... 257/691 |
| 2004/0169289 A1 | 9/2004 | Satou et al. |
| 2005/0161785 A1 | 7/2005 | Kawashima et al. |
| 2006/0197187 A1* | 9/2006 | Lohninger et al. ......... 257/584 |
| 2006/0263958 A1* | 11/2006 | Kajimoto et al. .......... 438/195 |
| 2007/0045785 A1* | 3/2007 | Noquil ....................... 257/666 |
| 2007/0145573 A1 | 6/2007 | Otremba |
| 2007/0182003 A1* | 8/2007 | Huber ........................ 257/734 |
| 2007/0210430 A1 | 9/2007 | Kagii et al. |
| 2007/0222044 A1 | 9/2007 | Otremba |
| 2007/0228556 A1 | 10/2007 | Hosseini et al. |
| 2007/0284720 A1 | 12/2007 | Otremba et al. |
| 2009/0020861 A1* | 1/2009 | Otremba .................... 257/676 |
| 2009/0160046 A1* | 6/2009 | Otremba et al. ........... 257/700 |
| 2012/0286293 A1* | 11/2012 | Otremba et al. ............. 257/77 |

OTHER PUBLICATIONS

Notice of Allowance mailed Nov. 15, 2011, in U.S. Appl. No. 12/241,742.

* cited by examiner

A-A'

A-A'

B-B'

A-A'

B-B'

A-A'

B-B'

A-A'

B-B'

44

A-A'

B-B'

A-A'

B-B'

US 8,691,631 B2

DEVICE INCLUDING TWO MOUNTING SURFACES

CROSS-REFERENCE TO RELATED APPLICATIONS

This Utility Patent Application is a divisional application of U.S. application Ser. No. 12/241,742, filed Sep. 30, 2008, which is incorporated herein by reference.

BACKGROUND

This invention relates to an electronic device with two mounting surfaces, a system containing such a device and a method of manufacturing thereof.

Power semiconductor chips may, for example, be integrated into electronic devices. Power semiconductor chips are suitable, in particular, for the switching or control of currents and/or voltages. Power semiconductor chips may, for example, be implemented as power MOSFETs, IGBTs, JFETs, power bipolar transistors or power diodes.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
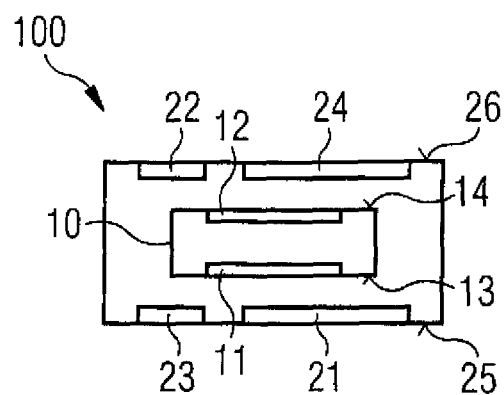
FIG. 1 schematically illustrates a cross-sectional view of one embodiment of a device including two mounting surfaces.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this Specification, the terms "coupled" and/or "electrically coupled" are not meant to mean that the elements must be directly coupled together; intervening elements may be provided between the "coupled" or "electrically coupled" elements.

Devices containing one or more semiconductor chips are described below. The semiconductor chips may be of different types, may be manufactured by different technologies and may include for example integrated electrical, electro-optical or electro-mechanical circuits and/or passives. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor chips may include control circuits, microprocessors or microelectromechanical components. Semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements on its two main surfaces, that is to say on its top side and bottom side. Power semiconductor chips may have a vertical structure. By way of example, the source electrode and gate electrode of a power MOSFET may be situated on one main surface, while the drain electrode of the power MOSFET is arranged on the other main surface. Furthermore, the devices described below may include integrated circuits to control the integrated circuits of other semiconductor chips, for example the integrated circuits of power semiconductor chips. The semiconductor chips need not be manufactured from specific semiconductor material, for example Si, SiC, SiGe, GaAs, and, furthermore, may contain inorganic and/or organic materials that are not semiconductors, such as for example insulators, plastics or metals. Moreover, the semiconductor chips may be packaged or unpackaged.

The semiconductor chips have electrodes (or contact pads) which allow electrical contact to be made with the integrated circuits included in the semiconductor chips. One or more metal layers may be applied to the electrodes of the semiconductor chips. The metal layers may be manufactured with any desired geometric shape and any desired material composition. The metal layers may, for example, be in the form of a layer covering an area. Any desired metal or metal alloy, for example aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible. The electrodes may be situated on the active main surfaces of the semiconductor chips or on other surfaces of the semiconductor chips.

The semiconductor chips may be placed on carriers. The carriers may be of any shape, size and material. During the fabrication of the devices the carriers may be connected to each other. The carriers may also be made from one piece. The carriers may be connected among each other by connection device with the purpose of separating some of the carriers in the course of the fabrication. Separation of the carriers may be carried out by mechanical sawing, a laser beam, cutting, stamping, milling, etching or any other appropriate method. The carriers may be electrically conductive. They may be fabricated from metals or metal alloys including, for example, copper, copper alloys, iron nickel, aluminum, aluminum alloys, steel, stainless steel or other appropriate materials. The carriers may be, for example, a leadframe or a part of a leadframe. Furthermore, the carriers may be plated with an electrically conductive material, for example copper, silver, iron nickel or nickel phosphorus. Instead of using a leadframe, the carriers may be fabricated by electrochemical deposition of metal material, for example electroless and/or galvanic deposition.

The devices may include one or more electrically insulating layers. The electrically insulating layers may cover any fraction of any number of surfaces of the components of the device, such as the carrier and the semiconductor chip integrated in the device. The electrically insulating layers may serve various functions. They may be used, for example, to electrically insulate components of the device from each other and/or from external components, but they may also be used as platforms to mount other components, for example wiring layers or contact elements. The electrically insulating layers may be fabricated using various techniques, for example using stencil printing, screen printing or any other appropriate printing technique. Furthermore, the electrically insulating layers may be deposited from a gas phase or a solution or may be laminated as foils. The electrically insulating layers may, for example, be made from organic materials, such as imide, epoxy or other thermosetting materials, photoresist, silicon nitride, metal oxides, semiconductor oxides, ceramics or diamond-like carbon. Furthermore, a mold material may be used as the electrically insulating material. The mold material may be any appropriate thermoplastic or thermosetting material. Various techniques may be employed to cover the components with the mold material, for example compression molding, injection molding, powder molding or liquid molding.

One or more metal layers may be placed over the semiconductor chip and/or the electrically insulating layers. The metal layers may, for example, be used to produce a redistribution layer. The metal layers may be used as wiring layers to make electrical contact with the semiconductor chips from outside the devices and/or to make electrical contact with other semiconductor chips and/or components contained in the devices. The metal layers may be manufactured with any desired geometric shape and any desired material composition. The metal layers may, for example, be composed of conductor tracks, but may also be in the form of a layer covering an area. Any desired metal, for example aluminum, nickel, palladium, silver, tin, gold or copper, or metal alloy may be used as the material. The metal layers need not be homogenous or manufactured from just one material, that is to say various compositions and concentrations of the materials contained in the metal layers are possible. Furthermore, the metal layers may be arranged above or below or between electrically insulating layers.

The devices described below include external contact elements or external contact pads, which may be of any shape and size. The external contact elements may be accessible from outside the device and may thus allow electrical contact to be made with the semiconductor chips from outside the device. Furthermore, the external contact elements may be thermally conductive and may serve as heat sinks for dissipating the heat generated by the semiconductor chips. The external contact elements may be composed of any desired electrically conducting material, for example of a metal, such as copper, aluminum or gold, a metal alloy or an electrically conducting organic material. Some of the external contact elements may be leads of a leadframe.

The devices may have mounting surfaces. The mounting surfaces may serve to mount the device onto another component, for example a circuit board, such as a PCB (Printed Circuit Board). External contact elements may be disposed on the mounting surface to allow to electrically couple the device to the component on which the device is mounted. Solder deposits, such as solder balls, or other appropriate connection elements may be used to establish an electrical and mechanical connection between the device and the component on which the device is mounted.

FIG. 1 schematically illustrates a cross-sectional view of a device 100. The device 100 includes exactly one semiconductor chip 10. In one embodiment, the semiconductor chip 10 is a power semiconductor chip having a first electrode 11 and a second electrode 12. The first electrode 11 is arranged on a first surface 13 of the power semiconductor chip 10, and the second electrode 12 is arranged on a second surface 14 of the power semiconductor chip 10. The second surface 14 is opposite to the first surface 13.

The device 100 further includes a first external contact element 21, a second external contact element 22, a third external contact element 23 and a fourth external contact element 24. The first and second external contact elements 21, 22 are electrically coupled to the first electrode 11 of the power semiconductor chip 10. The electrical connections between the first and second external contact elements 21, 22 and the power semiconductor chip 10 are not illustrated in FIG. 1. The third and fourth external contact elements 23, 24 are electrically coupled to the second electrode 12 of the power semiconductor chip 10. These electrical connections are also not illustrated in FIG. 1.

Moreover, the device 100 includes a first mounting surface 25 and a second mounting surface 26. The first and third external contact elements 21, 23 are disposed on the first mounting surface 25, and the second and fourth external contact elements 22, 24 are disposed on the second mounting surface 26.

Figure 2:
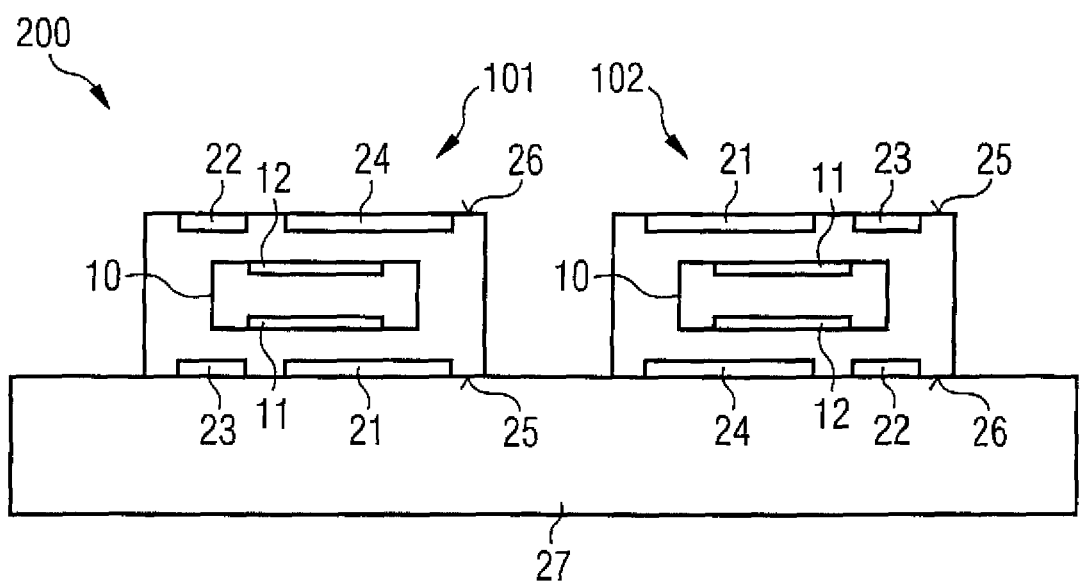
FIG. 2 schematically illustrates a cross-sectional view of one embodiment of a system including a circuit board and two devices mounted on the circuit board.

FIG. 2 schematically illustrates a cross-sectional view of a system 200. The system 200 includes a first device 101, a second device 102 and a circuit board 27. The first and second devices 101, 102 include components that are similar or identical to the components of the device 100 illustrated in FIG. 1. Therefore similar or identical components of the devices 100, 101 and 102 are denoted by the same reference numerals. As the device 100 each of the devices 101 and 102 may include exactly one semiconductor chip, but each of the devices 101 and 102 may also include more than one semiconductor chip.

The first device 101 is mounted on the circuit board 27 with its first mounting surface 25 facing the circuit board 27. The second device 102 is mounted on the circuit board 27 with its second mounting surface 26 facing the circuit board 27.

Figure 3A:
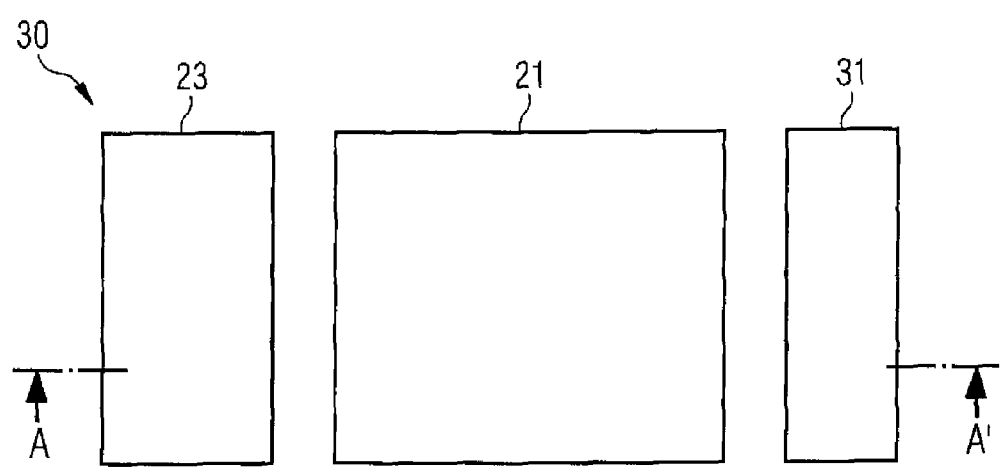
FIGS. 3A to 3J schematically illustrate a top plan view and a cross-sectional view of one embodiment of a method of manufacturing devices including two mounting surfaces using a leadframe.
Figure 3A:
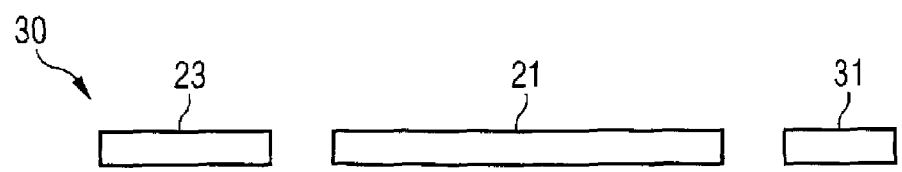
Figure 3B:
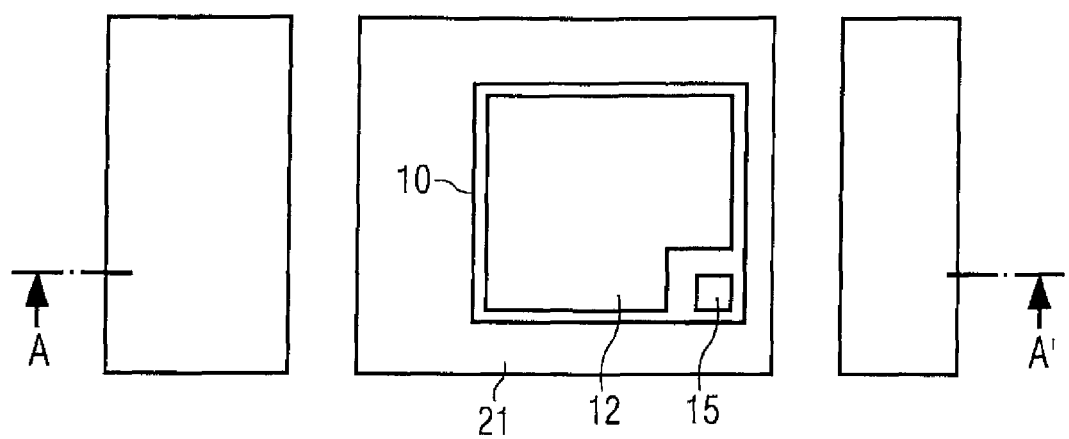
Figure 3B:
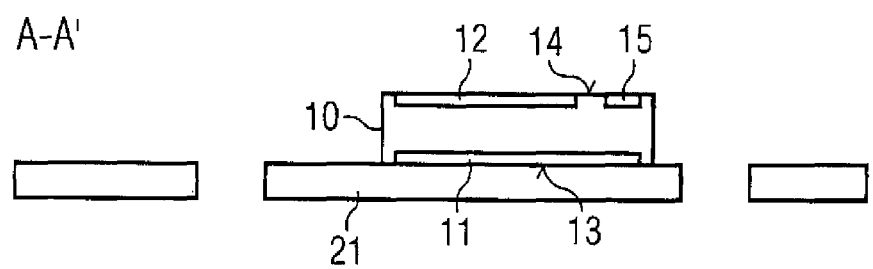
Figure 3C:
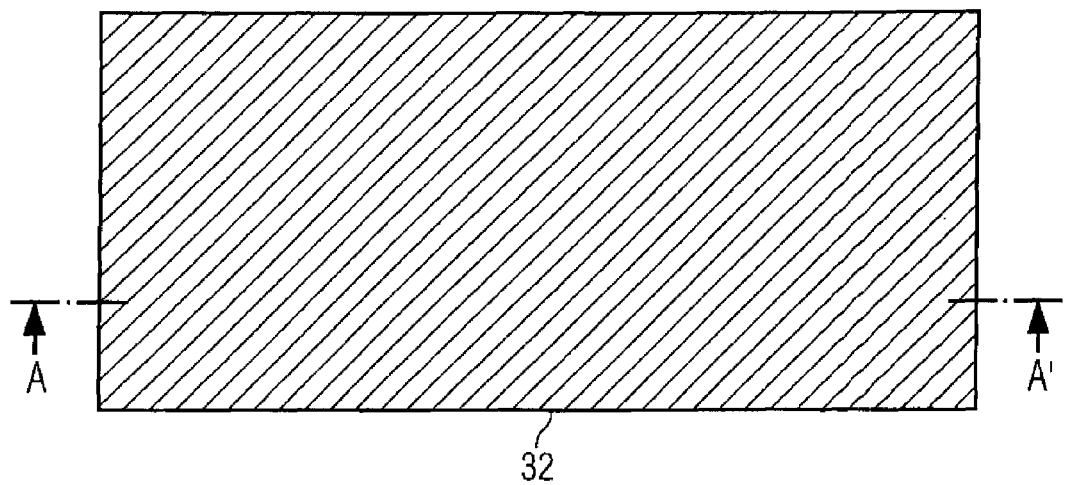
Figure 3C:
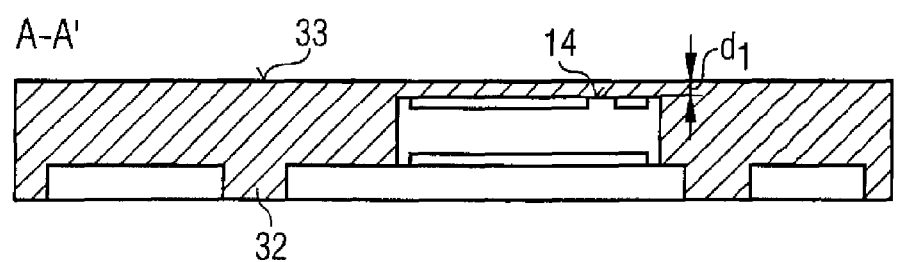
Figure 3D:
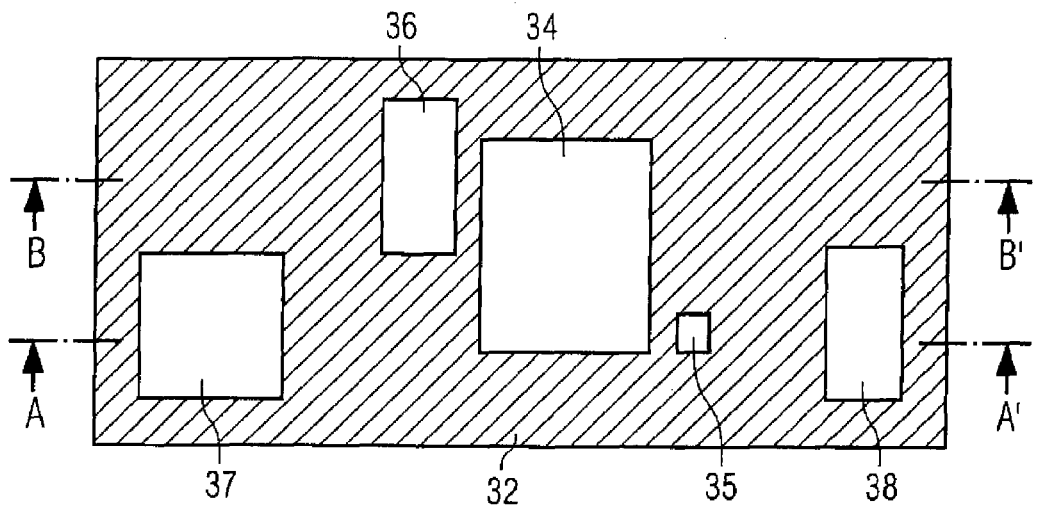
Figure 3D:
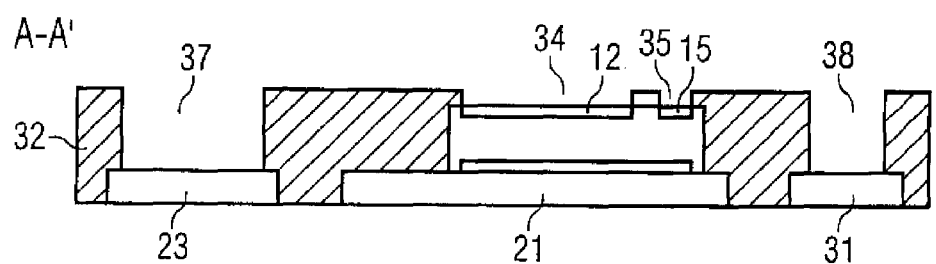
Figure 3D:
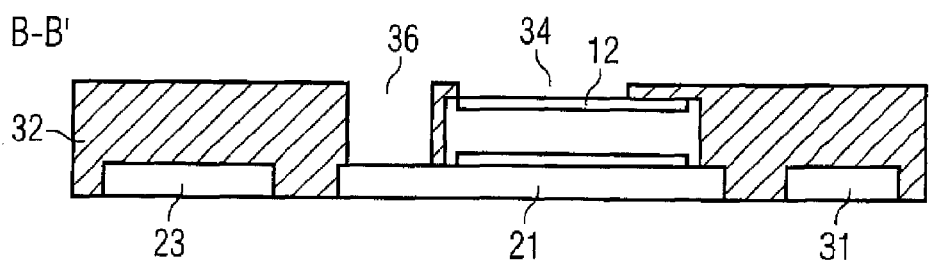
Figure 3E:
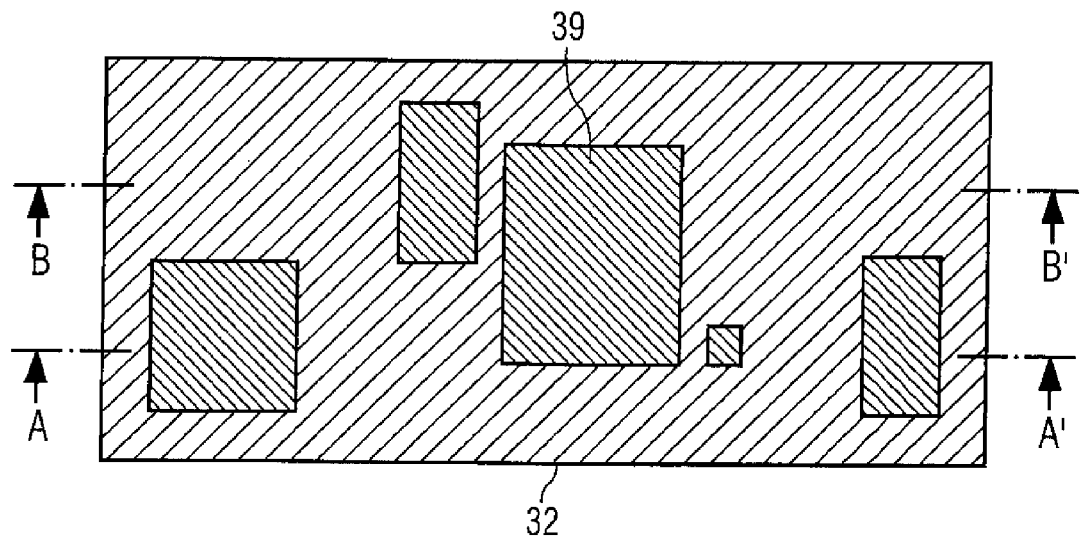
Figure 3E:
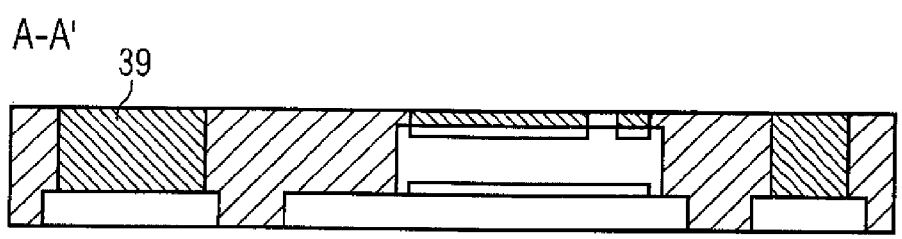
Figure 3E:
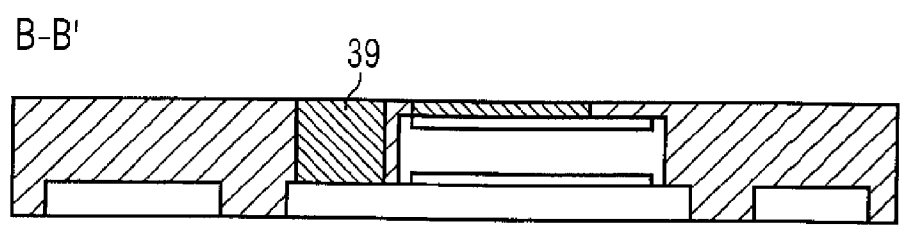
Figure 3F:
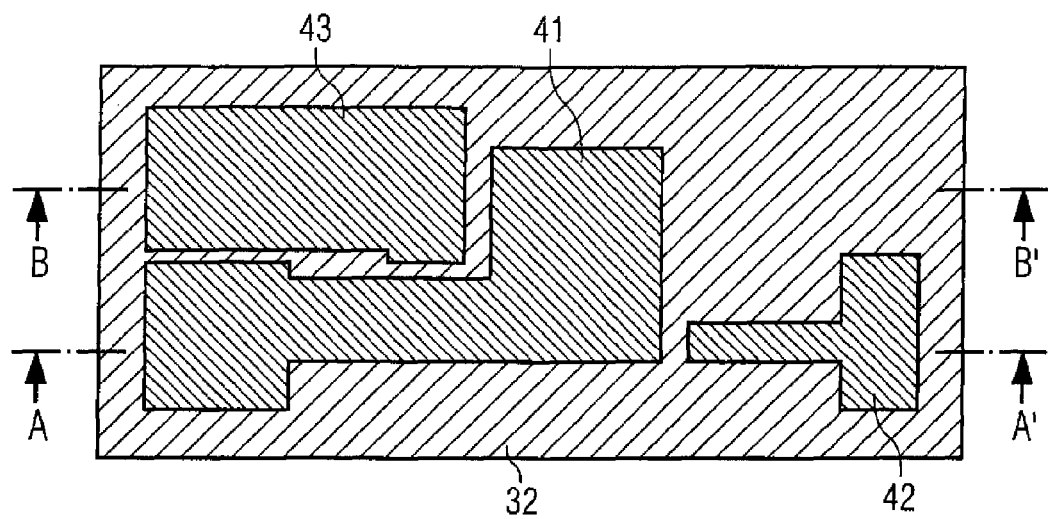
Figure 3F:
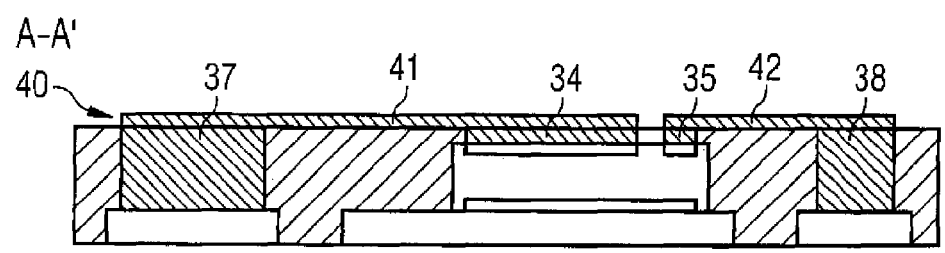
Figure 3F:
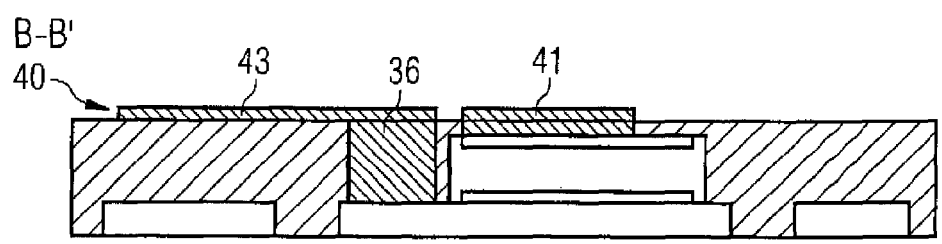
Figure 3G:
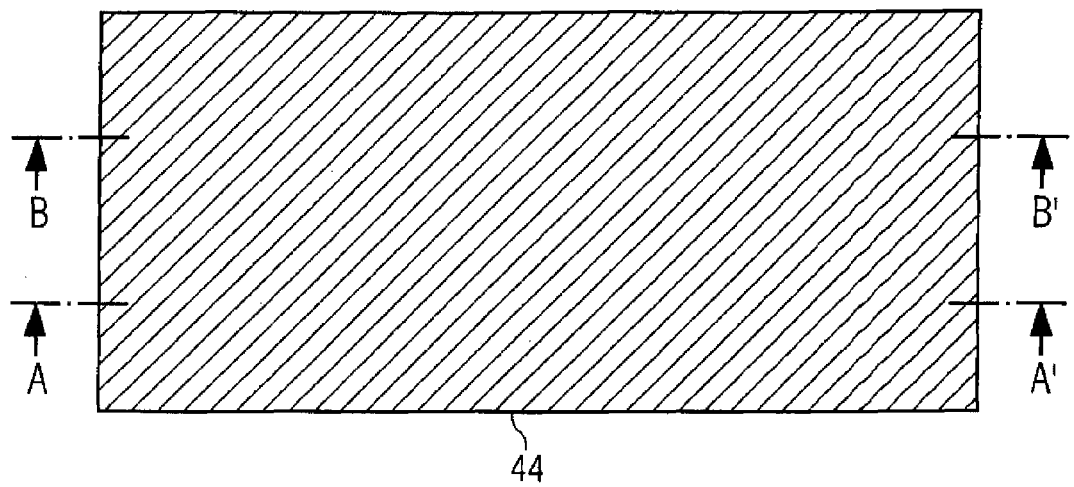
Figure 3G:
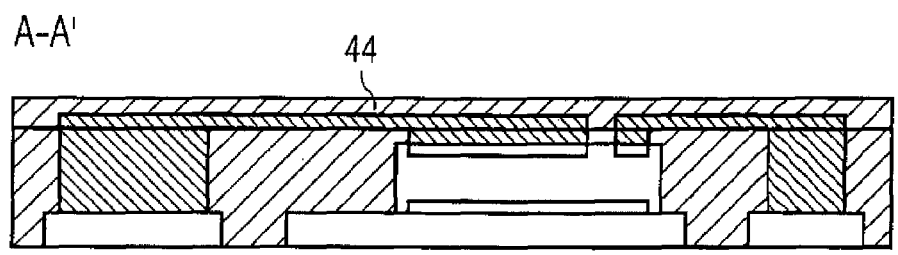
Figure 3G:
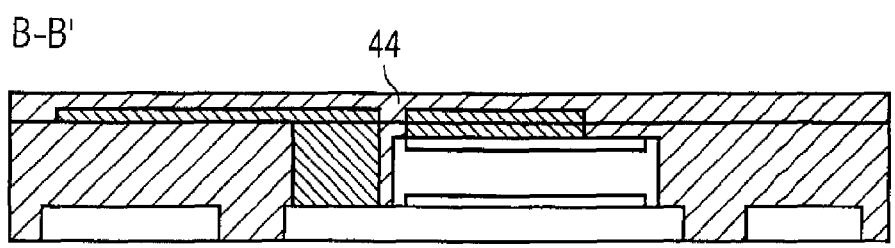
Figure 3H:
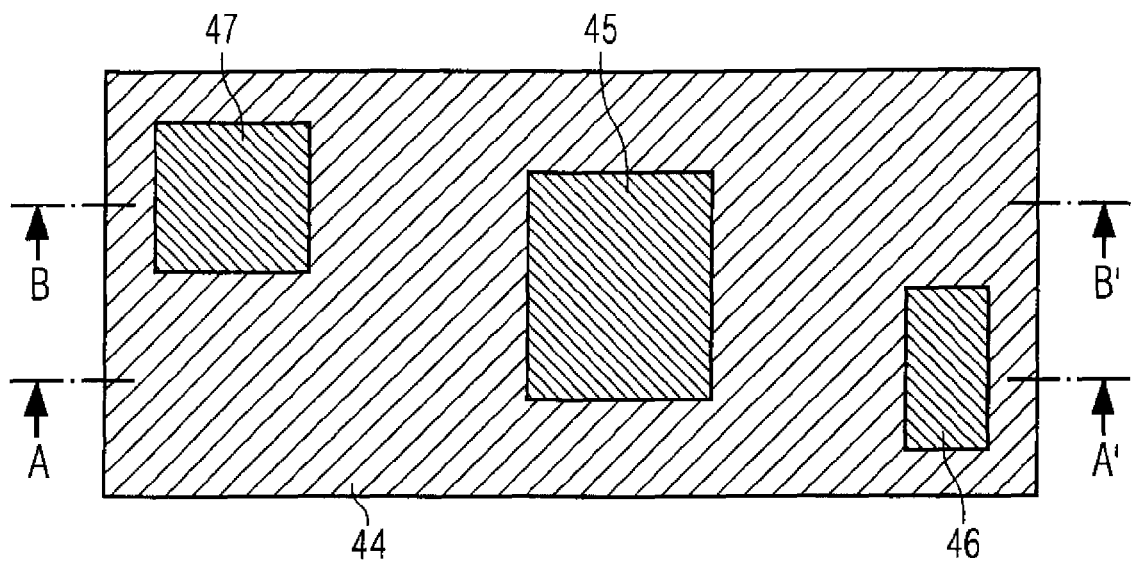
Figure 3H:
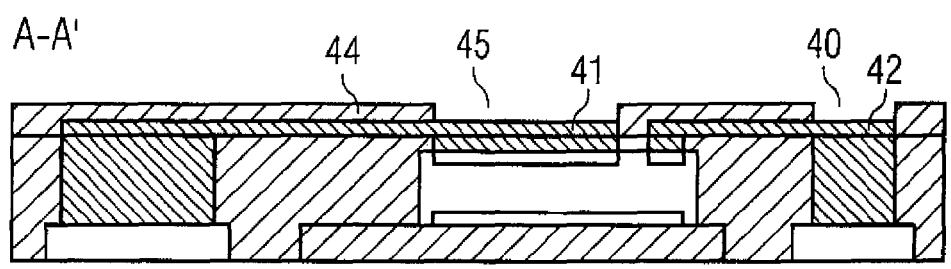
Figure 3H:
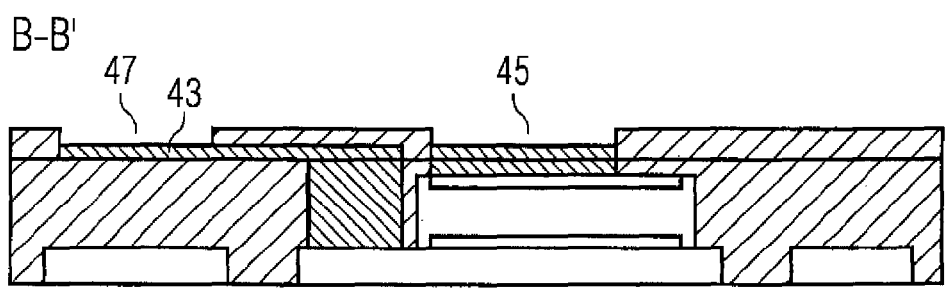
Figure 3I:
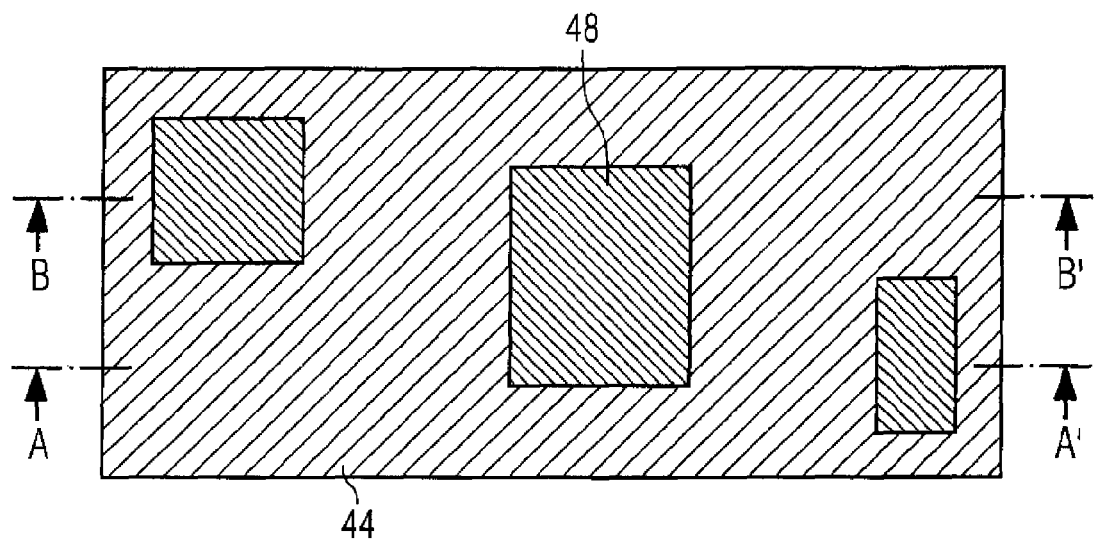
Figure 3I:
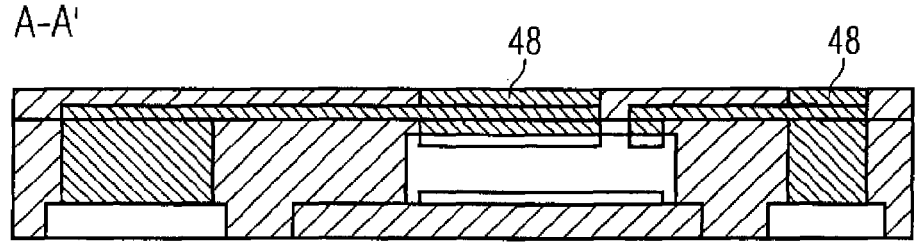
Figure 3I:
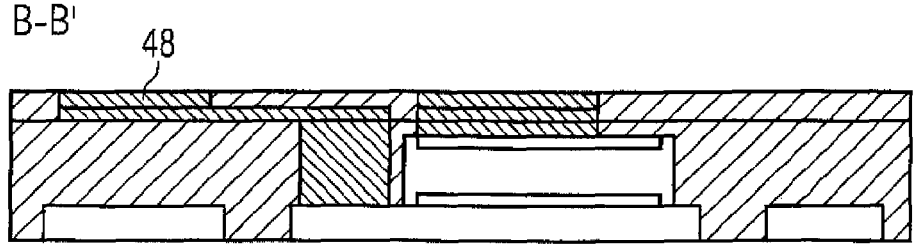
Figure 3J:
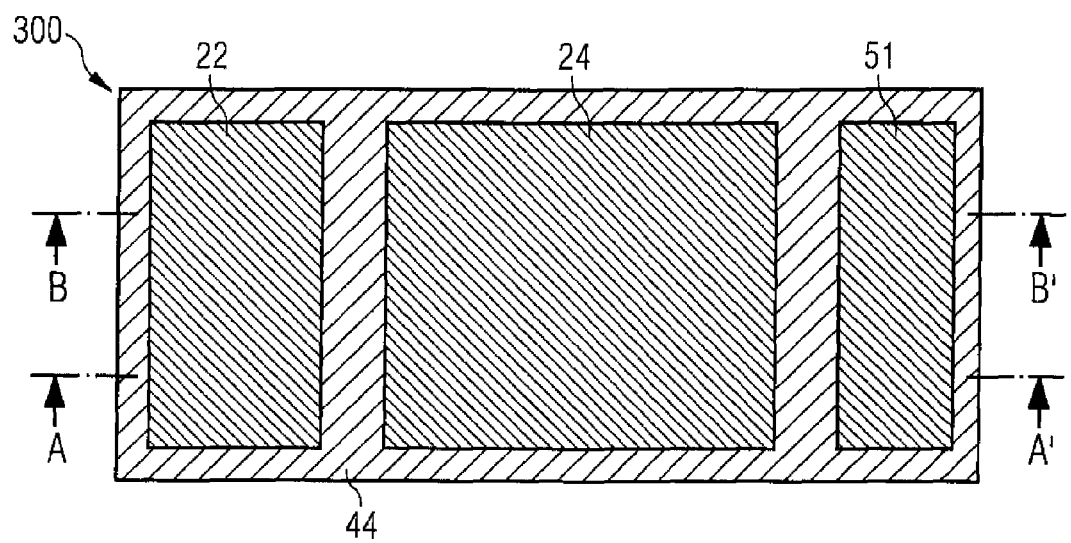
Figure 3J:
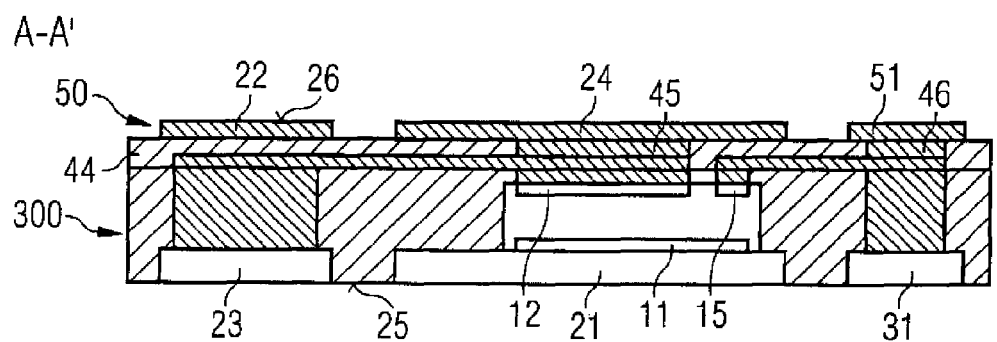
Figure 3J:
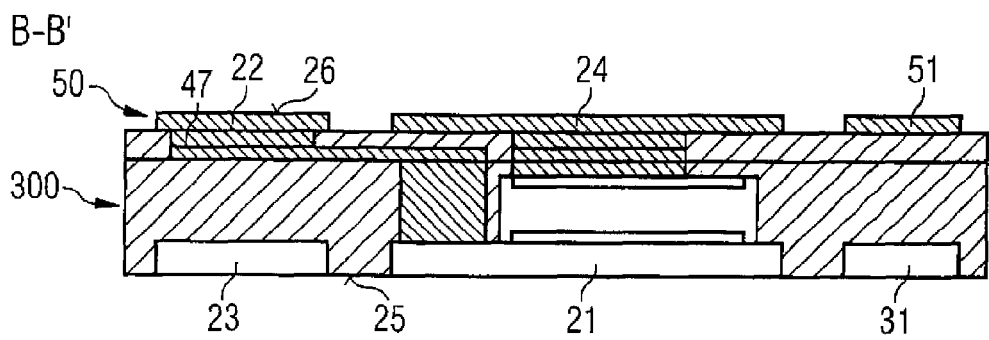

FIGS. 3A to 3J schematically illustrate a method for production of a device 300, which is illustrated in FIG. 3J. The device 300 is an implementation of the device 100 illustrated in FIG. 1. The details of the device 300 that are described below can therefore be likewise applied to the device 100. Similar or identical components of the devices 100 and 300 are denoted by the same reference numerals.

In FIG. 3A a carrier 30 is provided. The carrier 30 is illustrated in a top plan view (top) and a cross-sectional view (bottom) along the line A-A' depicted in the top plan view. In one embodiment, the carrier 30 is a leadframe including external contact elements 21, 23 and 31.

The leadframe 30 may have any geometric shape and its external contact elements 21, 23 and 31 may be arranged in any way. The leadframe 30 is not limited to any size, for example the leadframe 30 may have a thickness in the range from 100 µm to 1 mm or may be even thicker. The leadframe 30 may be manufactured from a metal, for example, copper, or a metal alloy, for example, iron nickel. The leadframe 30 may be plated with an electrically conductive material, for example copper, silver, iron nickel or nickel phosphorus. The leadframe 30 may have been stamped or milled in order to generate the outer shape of the leadframe 30 as illustrated in FIG. 3A. The leadframe 30 may include further die pads and/or external contact elements which are not illustrated in FIG. 3A.

A power semiconductor chip 10 may be placed over the external contact element 21 serving as a die pad as illustrated in FIG. 3B. Further semiconductor chips may additionally be placed over further die pads of the leadframe 30 which are not illustrated in FIG. 3B. The power semiconductor chip 10 may have a first electrode 11 on a first surface 13 and a second electrode 12 on a second surface 14 that is opposite to the first surface 13. The power semiconductor chip 10 may, for example, be a power diode or a power transistor, such as a power MOSFET, an IGBT, a JFET or a power bipolar transistor. In the case of a power MOSFET, which is exemplarily illustrated in FIG. 3B, the first and second electrodes 11 and 12 may be drain and source electrodes (load electrodes), respectively. Furthermore, the power semiconductor chip 10 may have a third electrode 15 on its second surface 14 functioning as a gate electrode (control electrode) in the case the power semiconductor chip 10 is a power MOSFET. During operation, voltages of up to 5, 50, 100, 500 or 1000 V or even higher may be applied between the load electrodes 11 and 12. The switching frequency applied to the control electrode 15 may be in the range from 1 kHz to 100 MHz, but may also be outside this range.

The power semiconductor chip 10 may be mounted onto the external contact element 21 with its first surface 13 facing the leadframe 30. The drain electrode 11 may be electrically connected to the electrically conductive external contact element 21. The electrical connection between the drain electrode 11 of the power semiconductor chip 10 and the leadframe 30 may, for example, be produced by reflow soldering, vacuum soldering, diffusion soldering or adhesive bonding by using an electrically conductive adhesive.

If diffusion soldering is used as a connecting technique, it is possible to use solder materials which lead to intermetallic phases after the end of the soldering operation at the interface between the leadframe 30 and the power semiconductor chip 10 on account of interface diffusion processes. In this case, the use of Sn, AuSn, AgSn, CuSn, AgIn, AuIn, CuIn, AuSi or Au solders is conceivable. If the power semiconductor chip 10 is adhesively bonded to the leadframe 30, it is possible to use electrically conductive adhesives which may be based on epoxy resins and be enriched with gold, silver, nickel or copper in order to produce the electrical conductivity.

An electrically insulating layer 32 may be deposited on the exposed parts of at least the top surface of the leadframe 30 and the power semiconductor chip 10 as illustrated in FIG. 3C. The deposition of the electrically insulating layer 32 may, for example, be performed by stencil printing, screen printing or any other appropriate printing technique. In one embodiment, the electrically insulating layer 32 may be laminated as a foil or sheet onto the underlying structures by applying vacuum as well as heat and pressure for a suitable time. It may also be provided that an electrically insulating material is deposited from a solution or a gas phase and may be built-up in a layer-by-layer fashion to a desired thickness. Techniques that can be employed for this kind of deposition are, for example, physical or chemical vapor deposition, spinning, dispensing, dipping, spraying, injection molding, compression molding, powder molding or liquid molding. The electrically insulating layer 32 may be fabricated from a polymer, such as parylene, a photoresist material, imide, epoxy, duroplast, a silicone, a mold material, silicon nitride or an inorganic, ceramic-like material, such as silicone-carbon compounds.

The height $d_1$ of the electrically insulating layer 32 above the second surface 14 of the power semiconductor chip 10 may be at least 10 µm and in one embodiment around 30 µm. After its deposition the electrically insulating layer 32 may provide a planar upper surface 33, which is coplanar to the upper surface of the leadframe 30. The planar surface 33 may be used to attach other components of the device 300.

The electrically insulating layer 32 may be structured as illustrated in FIG. 3D. A plurality of cutouts or through-holes 34 to 38 are created in the electrically insulating layer 32. The through-holes 34 and 35 expose at least portions of the source electrode 12 and the gate electrode 15 of the power semiconductor chip 10, respectively. The through-holes 36, 37 and 38 expose at least portions of the upper surfaces of the external contact elements 21, 23 and 31, respectively. In order to illustrate the through-hole 36, a further cross-sectional view (bottom) along the line B-B' depicted in the top plan view is illustrated in FIG. 3D. The through-holes 34 to 38 allow electrical connections to be made to the exposed regions.

If the electrically insulating layer 32 contains photo-active components, the electrically insulating layer 32 may be photo-lithographically structured. As an alternative the electrically insulating layer 32 may, for example, be structured by a stamping process, laser ablation, etching, mechanical drilling or any other suitable process known to a person skilled in the art.

In a further embodiment, which is not illustrated in the Figures, the electrically insulating layer 32 is provided as a polymer foil or sheet with a plurality of through-holes 34 to 38 before it is laminated onto the leadframe 30 and the power semiconductor chip 10. The through-holes 34 to 38 may be provided by stamping out regions of the polymer foil or sheet. The size and arrangement of these regions correspond to the size and arrangement of the surfaces of the elements, which are desired to be exposed.

The through-holes 34 to 38 produced in the electrically insulating layer 32 may be filled with a metal 39 or any other appropriate electrically conductive material in order to form through-connections in the electrically insulating layer 32 as illustrated in FIG. 3E. Copper, iron, nickel, aluminum or other metals or metal alloys may be used as the material. The metal 39 may be deposited in the through-holes 34 to 38 by using a galvanic deposition method or any other appropriate deposition method.

The electrically insulating layer 32 may act as a platform for the deposition of a metal layer 40 as illustrated in FIG. 3F. In one embodiment, the metal layer 40 may have a thickness in the range from 10 to 300 µm or may even be thicker. The metal layer 40 may be structured as illustrated in FIG. 3F so that only some areas of the electrically insulating layer 32 are covered by the metal layer 40. For example, after structuring the metal layer 40 may form metal areas 41, 42 and 43. The metal area 41 may electrically couple the through-connections 34 and 37 to each other. The metal area 42 may electrically couple the through-connections 35 and 38 to each other, and the metal area 43 may be coupled to the through-connection 36.

The metal layer 40 may be fabricated by using a galvanic deposition method. For that, a seed layer is first deposited onto the top surfaces of the electrically insulating layer 32 and the through-connections 34 to 38. The seed layer usually has a thickness of some hundred nanometers. Materials such as palladium or titanium may be used for the seed layer.

The thickness of the seed layer may be increased by depositing a further layer of an electrically conducting material onto the seed layer. For example, a layer of copper may be electroless deposited onto the seed layer. This copper layer may have a thickness of less than 1 µm. Afterwards another layer of copper may be galvanically deposited, which may have a thickness of more than 10 µm. The electroless copper deposition may also be omitted. The metal layer 40 may be structured after the completed deposition process of all its layers or after the deposition of the seed layer.

In another embodiment, the seed layer may be deposited by a vacuum deposition process, such as sputtering. For example, first a layer of titanium having a thickness of, for example, about 50 nm and afterwards a layer of copper having a thickness of, for example, about 200 nm are sputtered. The copper layer may then be used as a seed layer to galvanically deposit a further copper layer having a thickness of more than 10 µm.

As further embodiments, other deposition methods, such as physical vapor deposition, chemical vapor deposition, spin-on processes, spray deposition or ink jet printing may also be used. Furthermore, the metal layer 40 may be a metal film, for example a copper film, which is laminated onto the top surfaces of the electrically insulating layer 32 as well as the through-connections 34 to 38. Vacuum, heat and pressure may be applied for a time suitable to attach the metal layer 40 to the underlying materials.

An electrically insulating layer 44 may be deposited on top of the metal layer 40 and the exposed parts of the electrically insulating layer 32 as illustrated in FIG. 3G. The electrically insulating layer 44 may be fabricated from a polymer, such as parylene, a photoresist material, imide, epoxy, duroplast, a silicone, a mold material, silicon nitride or an inorganic, ceramic-like material, such as silicone-carbon compounds. For the deposition of the electrically insulating material one of the techniques described above in connection with the deposition of the electrically insulating layer 32 may be utilized.

The electrically insulating layer 44 may be structured as illustrated in FIG. 3H. Through-holes 45, 46 and 47 are created in the electrically insulating layer 44. The through-holes 45, 46 and 47 expose at least portions of the metal areas 41, 42 and 43, respectively. The through-holes 45 to 47 may be produced by employing one of the techniques described above in connection with the production of the through-holes 34 to 38.

The through-holes 45 to 47 produced in the electrically insulating layer 44 may be filled with a metal 48 or any other appropriate electrically conductive material in order to form through-connections in the electrically insulating layer 44 as illustrated in FIG. 3I. Copper, iron, nickel, aluminum or other metals or metal alloys may be used as the material. The metal 48 may be deposited in the through-holes 45 to 47 by using a galvanic deposition method or any other appropriate deposition method.

The electrically insulating layer 44 may act as a platform for the deposition of a metal layer 50 as illustrated in FIG. 3J. In one embodiment, the metal layer 50 may have a thickness in the range from 10 to 400 µm or may even be thicker. The metal layer 50 may be structured as illustrated in FIG. 3J in order to obtain external contact elements 22, 24 and 51. The external contact elements 22, 24 and 51 may be electrically coupled to the through-connections 47, 45 and 46, respectively. The deposition and structuring of the metal layer 50 may be carried out by employing methods as described above in connection with the deposition and structuring of the metal layer 40. For example, electrochemical deposition methods, such as electroless and/or galvanic deposition, may be used to produce the metal layer 50.

After the deposition and structuring of the metal layer 50, the devices 300 may be separated from one another if necessary by separation of the leadframe 30 (not illustrated in the Figures). Separating the leadframe 30 may, for example, be performed by sawing, cutting, etching or a laser beam or other electromagnetic radiation.

The device 300 illustrated in FIG. 3J contains one and only one semiconductor chip, which is the power MOSFET 10 in the present embodiment. The power MOSFET 10 has three electrodes 11, 12 and 15, and each of its electrodes 11, 12 and 15 is electrically coupled to a respective external contact element on a first mounting surface 25 of the device 300 and a respective external contact element on a second mounting surface 26 of the device 300, which is opposite to the first mounting surface 25. In detail, the drain electrode 11 is electrically coupled to the external contact elements 21 and 22. The source electrode 12 is electrically coupled to the external contact elements 23 and 24. The gate electrode 15 is electrically coupled to the external contact elements 31 and 51. Thus, the device 300 may be mounted on a circuit board with either its first mounting surface 25 facing the circuit board or its second mounting surface 26 facing the circuit board.

FIG. 3A (top) illustrates the geometries and arrangement of the external contact elements 21, 23 and 31 disposed on the first mounting surface 25 of the device 300. FIG. 3J (top) illustrates the geometries and arrangement of the external contact elements 22, 24 and 51 disposed on the second mounting surface 26 of the device 300. It is to be noted that the external contact elements may have other geometries and sizes as illustrated in FIGS. 3A and 3J. Furthermore, other footprints may be used for the first and second mounting surfaces 25 and 26. In the embodiment illustrated in FIGS. 3A and 3J, both mounting surfaces 25 and 26 have the same footprints.

It may be provided that a pair of the external contact elements, which are electrically coupled to the same electrode of the power semiconductor chip 10, has different contact areas on the two mounting surfaces 25 and 26, wherein the contact area of an external contact element is the area of the respective external contact element exposed on the respective mounting surface configured to be attached to a circuit board. For example, as illustrated in FIGS. 3A and 3J the external contact element 22 has a smaller contact area than the external contact element 21. Furthermore, the external contact element 23 has a smaller contact area than the external contact element 24.

Moreover, it may be provided that the contact area of the external contact element 22 is smaller than 60% or 50% or 40% or 30% or 20% or 10% of the contact area of the external contact element 24. The contact area of the external contact element 23 may be smaller than 60% or 50% or 40% or 30% or 20% or 10% of the contact area of the external contact element 21.

The contact area of one of the electrodes of the power semiconductor chip 10 may be smaller than the contact area of the corresponding external contact element which is electrically coupled to the electrode. Furthermore, their shapes may be different. It is to be noted that the external contact elements 21 and 24 may extend beyond the power semiconductor chip 10 and may be arranged at least partly outside of a region defined by the contour of the power semiconductor chip 10.

It is obvious to a person skilled in the art that the device 300 is only intended to be an exemplary embodiment, and many variations are possible. For example, instead of using the leadframe 30 the external contact elements 21, 23 and 31 may be produced by electrochemical deposition of a metal. A cross-sectional view of a device 400 having such external contact elements 21, 23 and 31 is schematically illustrated in FIG. 4E. FIGS. 4A to 4E schematically illustrate one embodiment of a method for production of the device 400.

Figure 4A:
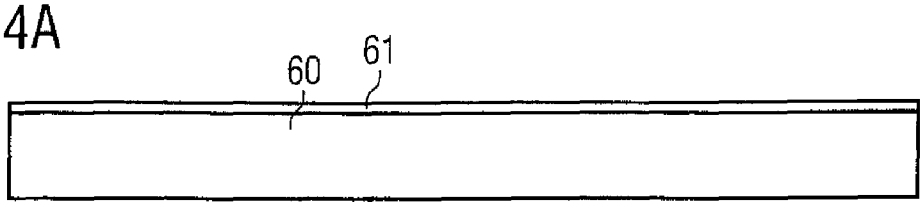
FIGS. 4A to 4E schematically illustrate a cross-sectional view of one embodiment of a method of manufacturing devices including two mounting surfaces using electrochemical deposition of a metal.

In order to manufacture the device 400, a carrier 60 is provided as illustrated in FIG. 4A. The carrier 60 may be a plate made of a rigid material, for example a metal, such as nickel, steel or stainless steel, laminate, film or a material stack. The carrier 60 may have at least one flat surface on which components of the device 400 can be placed. The shape of the carrier 60 is not limited to any geometric shape, for example the carrier 60 may be round or square-shaped. The carrier 60 may have any appropriate size. An adhesive tape 61, for example a double sided sticky tape, may be laminated onto the carrier 60.

Figure 4B:
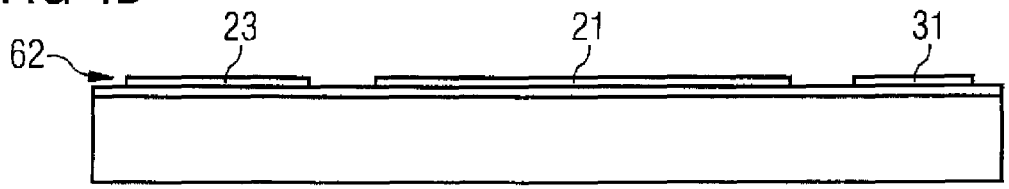

As illustrated in FIG. 4B a seed layer 62 may be deposited onto the top surface of the adhesive tape 61. The seed layer 62 usually has a thickness of some hundred nanometers. Materials such as palladium or titanium may be used for the seed layer 62.

Figure 4C:
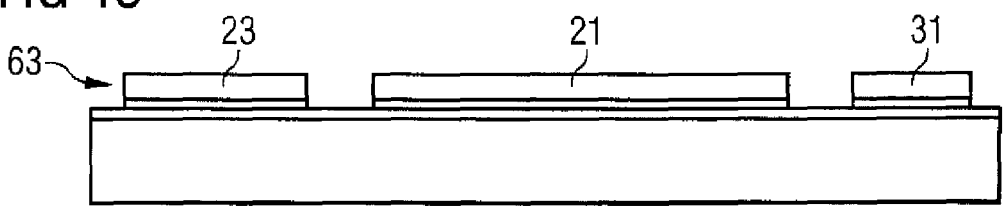

The thickness of the seed layer 62 may be increased by depositing a further layer of an electrically conducting material onto the seed layer 62. For example, a layer of copper may be electroless deposited onto the seed layer 62. In one embodiment, this copper layer may have a thickness of less than 1 μm. Afterwards another layer 63 of copper may be galvanically deposited as illustrated in FIG. 4C. The metal layer 63 may have a thickness of more than 10 μm. The electroless copper deposition may also be omitted. The metal layers 62 and 63 may be structured after the completed deposition process of all metal layers or after the deposition of the seed layer 62 in order to obtain the external contact elements 21, 23 and 31.

Figure 4D:
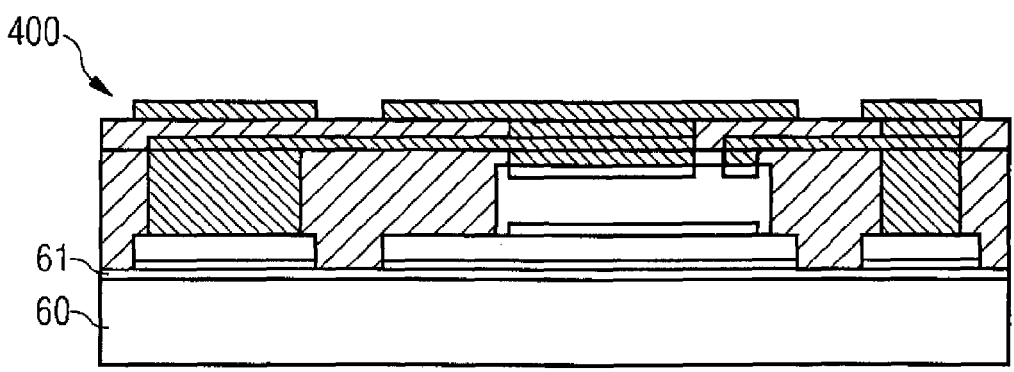
Figure 4E:
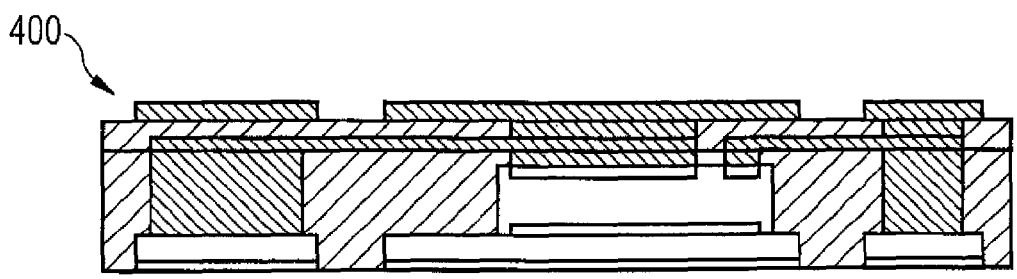

After the electrochemical fabrication of the external contact elements 21, 23 and 31 the fabrication processes illustrated in FIGS. 3B to 3J may be carried out in order to obtain the device 400 as illustrated in FIG. 4D.

The device 400 is released from the carrier 60, and the adhesive tape 61 is pealed from the device 400 as illustrated in FIG. 4E. The adhesive tape 61 may feature thermo-release properties, which allow the removal of the adhesive tape 61 during a heat-treatment. The removal of the adhesive tape 61 is carried out at an appropriate temperature, which depends on the thermo-release properties of the adhesive tape 61 and is usually higher than 150° C.

Figure 5:
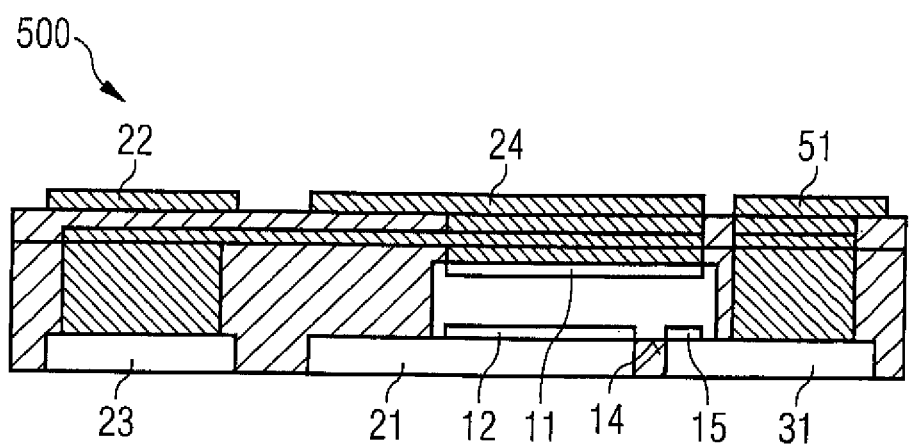
FIG. 5 schematically illustrates a cross-sectional view of one embodiment of a device including two mounting surfaces.

A further variation of the device 300 is illustrated in FIG. 5. A device 500 is schematically illustrated there in a cross-sectional view. In contrast to the device 300, the power MOSFET 10 is mounted with its second surface 14 on the leadframe 30 in the device 500. The source electrode 12 and the gate electrode 15 are electrically coupled to the external contact elements 21 and 31, respectively, for example by using diffusion soldering or any other appropriate technique.

Figure 8:
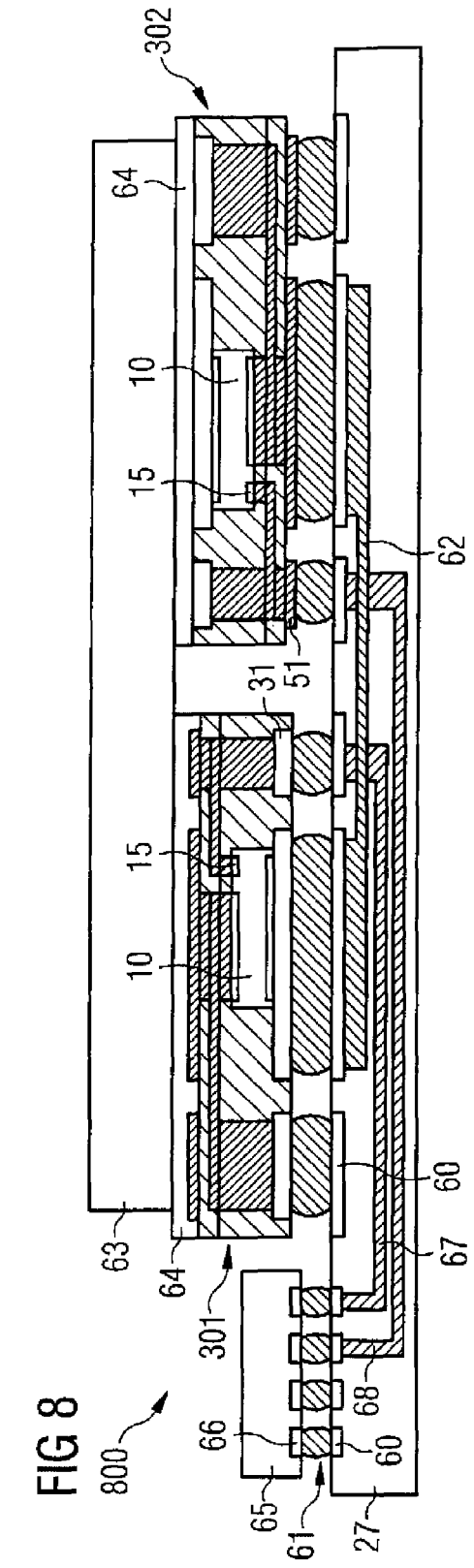
FIG. 8 schematically illustrates a cross-sectional view of one embodiment of a system including a circuit board, two devices mounted on the circuit board, a cooling element and a control device.

The devices 100, 300, 400 and 500 may be used as components of a half-bridge circuit. A basic circuit of a half-bridge 600 arranged between two nodes N1 and N2 is illustrated in FIG. 8. The half-bridge 600 consists of two switches S1 and S2 connected in series. Semiconductor chips, for example the power semiconductor chips 10 of the devices 100, 300, 400 or 500, may be implemented as the switches S1 and S2. Constant electrical potentials may be applied to the nodes N1 and N2. For example, a high potential, such as 10, 50, 100, 200, 500 or 1000 V or any other potential, may be applied to the node N1 and a low electrical potential, for example 0V, may be applied to the node N2. The switches S1 and S2 may be switched at frequencies in the range from 1 kHz to 100 MHz, but the switching frequencies may also be outside this range. This means that a varying electrical potential is applied to a node N3 arranged between the switches S1 and S2 during operation of the half-bridge 600. The potential of the node N3 varies in the range between the low and the high electrical potential.

The half-bridge 600 may, for example, be implemented in electronic circuits for converting DC voltages, DC-DC converters. DC-DC converters may be used to convert a DC input voltage provided by a battery or a rechargeable battery into a DC output voltage matched to the demand of electronic circuits connected downstream. DC-DC converters may be embodied as step-down converters, in which the output voltage is less than the input voltage, or as step-up converters, in which the output voltage is greater than the input voltage. Frequencies of several MHz or higher may be applied to DC-DC converters. Furthermore, currents of up to 50 A or even higher may flow through the DC-DC converters.

Figure 7:
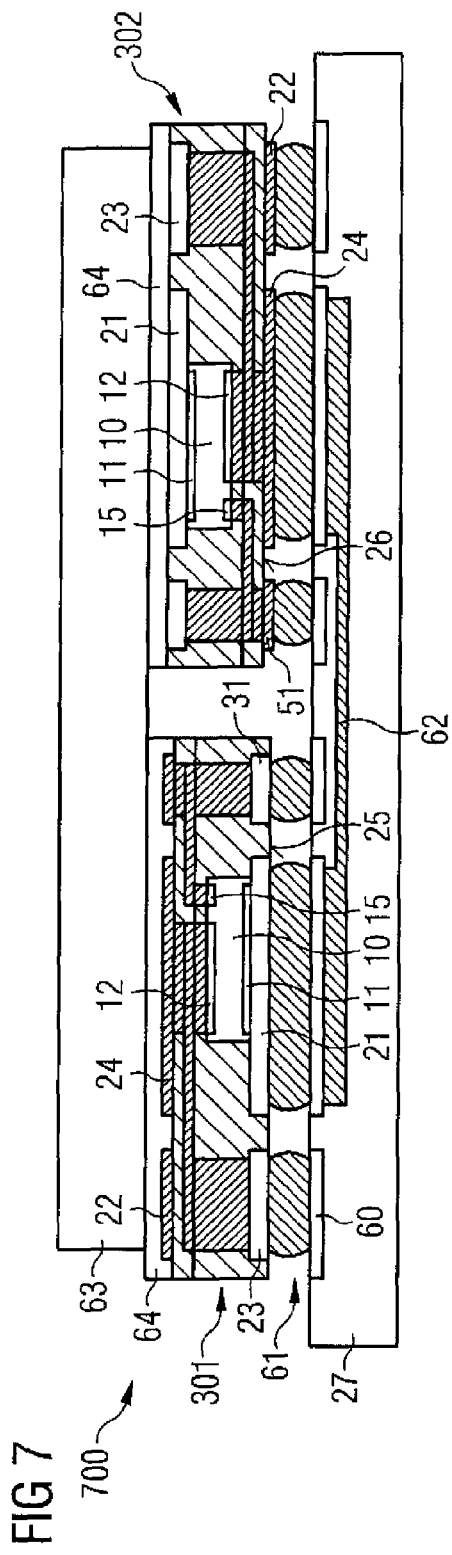
FIG. 7 schematically illustrates a cross-sectional view of one embodiment of a system including a circuit board, two devices mounted on the circuit board and a cooling element.

FIG. 7 schematically illustrates a cross-sectional view of a system 700. The system 700 is an implementation of the system 200 illustrated in FIG. 2. The system 700 includes a device 301, a device 302 and a circuit board 27. Both devices 301 and 302 may be identical and, furthermore, may be identical to the device 300 illustrated in FIG. 3J. The device 301 is mounted on the circuit board 27 with its first mounting surface 25 facing the circuit board 27, whereas the device 302 is mounted on the circuit board 27 with its second mounting surface 26 facing the circuit board 27. Further devices which are not illustrated in FIG. 7 may be additionally mounted on the circuit board 27. It is to be noted that the devices 301 and 302 may contain identical power semiconductor chips 10, but may also contain power semiconductor chips 10 of different types, different sizes and/or manufactured by different technologies.

The circuit board 27 may be a PCB and may include contact pads 60 on its upper surface to which the devices 301 and 302 are attached. For example, the external contact elements 21, 23 and 31 of the device 301 and the external contact elements 22, 24 and 51 of the device 302 may have been soldered to the contact pads 60 of the circuit board 27 by using solder deposits 61.

Figure 6:
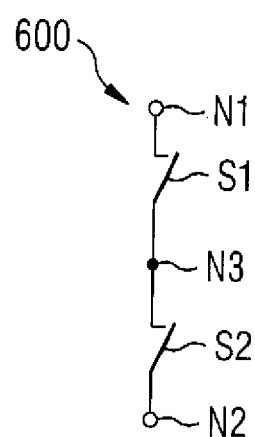
FIG. 6 illustrates a basic circuit of a half-bridge.

Exemplarily, one conductor track 62 of the circuit board 27 is illustrated in FIG. 7. The conductor track 62 electrically couples the external contact element 21 of the device 301 to the external contact element 24 of the device 302. Thus, the conductor track 62 electrically couples the drain electrode 11 of the power MOSFET 10 included in the device 301 to the source electrode 12 of the power MOSFET 10 included in the device 302. The device 301 and 302 mounted on the circuit board 27 therefore can be used as a half-bridge. When compared to the circuit 600 illustrated in FIG. 6, the external contact element 22 of the device 302 is the node N1, the external contact element 23 of the device 301 is the node N2 and the conductor track 62 is the node N3. During operation of the system 700, a high electrical potential is applied to the external contact element 22 of the device 302, and a low electrical potential is applied to the external contact element 23 of the device 301.

As illustrated in FIG. 7, a cooling element 63 (or heat sink) may be attached on top of the devices 301 and 302. The cooling element 63 may be electrically insulated from the top surfaces of the devices 301 and 302 by an electrically insulating layer 64. The electrically insulating layer 64 may, for example, be made of a foil, a paste or any other electrically insulating material having a sufficient thermal conductivity. The cooling element 63 dissipates the heat generated by the power semiconductor chips 10 of the devices 301 and 302 during operation.

Since the cooling element 63 usually contains a metal material, capacities are formed between the external contact elements disposed on the top surfaces of the devices 301, 302 and the cooling element 63. Since the contact areas of the external contact elements 21 and 24 disposed on the top surfaces of the devices 301, 302 are larger than the contact areas of the external contact elements 22 and 23 disposed on the top surfaces of the devices 301, 302, the capacities formed between the external contact elements 21, 24 and the cooling element 63, respectively, are larger than the capacities formed between the external contact elements 22, 23 and the cooling element 63, respectively. During operation of the system 700, constant electrical potentials are applied to the external contact elements 21, 24 on the top surfaces of the devices 301, 302 and varying electrical potentials are applied to the external contact elements 22, 23. That means that only the charges on the small capacitances formed by the external contact element 22 of the device 301 and the external contact element 23 of the device 302 need to be transferred from one of the capacitor "plates" to the other capacitor "plate" when switching the power semiconductor chips 10 of the devices 301, 302. As a result less charge needs to be transferred which causes a reduced energy consumption of the system 700 and an enhanced stability of the half-bridge circuit of the system 700.

FIG. 8 schematically illustrates a cross-sectional view of a system 800. The system 800 is a development of the system 700 illustrated in FIG. 7. The system 800 includes a control device 65, which is mounted on the circuit board 27. Solder deposits 61 attach external contact elements 66 of the control device 65 to the contact pads 60 of the circuit board 27. Moreover, conductor tracks 67 and 68 electrically couple the control device 65 to the external contact element 31 of the device 301 and the external contact element 51 of the device 302, respectively. The external contact elements 31 and 51 are coupled to the gate electrodes 15 of the power MOSFETs 10. The control device 65 may be configured to control the electrical potentials of the gate electrodes 15, thus controlling the switching of the power MOSFETs 10.

In addition, while a particular feature or aspect of one embodiment may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a device comprising:
defining exactly one semiconductor chip, the semiconductor chip being a power semiconductor chip and comprising a first electrode on a first surface and a second electrode on a second surface opposite to the first surface;
electrically coupling a first external contact element and a second external contact element to the first electrode of the semiconductor chip;
electrically coupling a third external contact element and a fourth external contact element to the second electrode of the semiconductor chip;
providing a first mounting surface on which the first and third external contact elements are disposed, the first mounting surface forming a first major surface of the device, the first external contact element being spaced from and positioned along a first edge side of the device, and the third external contact element being spaced from and positioned along a second edge side of the device opposite the first edge side; and
providing a second mounting surface on which the second and fourth external contact elements are disposed, the second mounting surface forming a second major surface of the device opposite the first major surface, the second external contact element being spaced from and positioned along the second edge side and the fourth external contact being spaced from and positioned along the first edge side; and
providing a fifth external contact element disposed on the first mounting surface and a sixth external contact element disposed on the second mounting surface, and electrically coupling the fifth and sixth external contact elements to a third electrode of the semiconductor chip, wherein the first, second, third, fourth, fifth, and sixth external contact elements are spaced between the first edge side and the opposite second edge side of the device, with the first external contact element being disposed between the third and fifth external contact elements and the fourth external contact element being disposed between the second and sixth external contact elements.

2. The method of claim 1, wherein the first and second electrodes are load electrodes.

3. The method of claim 1, wherein the first mounting surface is substantially parallel to the first surface of the semiconductor chip.

4. The method of claim 1, comprising making the first external contact element larger than the third external contact element and the fourth external contact element is larger than the second external contact element.

5. The method of claim 1, wherein the semiconductor chip is one of a MOSFET, a JFET, an IGBT, a bipolar transistor, and a diode.

6. The method of claim 1, wherein the first and second external contact elements are drain terminals, the third and fourth external contact elements are source terminals, and the fifth and sixth external contact elements are gate terminals of the power semiconductor chip.

7. A method of forming a device comprising;
defining exactly one semiconductor chip, the semiconductor chip being a power semiconductor chip and comprising a first electrode on a first surface and a second electrode on a second surface opposite to the first surface;
electrically coupling a first external contact element and a second external contact element to the first electrode of the semiconductor chip;
electrically coupling a third external contact element and a fourth external contact element to the second electrode of the semiconductor chip;
providing a first mounting surface on which the first and third external contact elements are disposed, the first mounting surface forming a first major surface of the device, the first external contact element being spaced from and positioned along a first edge side of the device, and the third external contact element being spaced from and positioned along a second edge side of the device opposite the first edge side; and
providing a second mounting surface on which the second and fourth external contact elements are disposed, the second mounting surface forming a second major surface of the device opposite the first major surface, the second external contact element being spaced from and positioned along the second edge side and the fourth external contact being spaced from and positioned along the first edge side; and
arranging the exactly one semiconductor chip above the first and third external contact elements, arranging the second and fourth external contact elements above the exactly one semiconductor chip, and arranging at least a portion of the second external contact element within a periphery of the third external contact element, wherein the number of external contact elements disposed on the first mounting surface is equal to the number of external contact elements disposed on the second mounting surface.

* * * * *